United States Patent [19]

Rebourg et al.

[11] Patent Number: 4,525,798
[45] Date of Patent: Jun. 25, 1985

[54] APPARATUS FOR PERFORMING A HADAMARD TRANSFORMATION

[76] Inventors: Jean-Claude Rebourg, 95, Avenue de la Clairiére, 78120 Rambouillet; Claude Despois, 2, Impasse du Domaine Premay en Yvelines, 78660 Ablis, both of France

[21] Appl. No.: 402,569

[22] Filed: Jul. 28, 1982

[30] Foreign Application Priority Data

Aug. 3, 1981 [FR] France .................................. 81 15034

[51] Int. Cl.³ .......................... G06G 7/12; H03H 15/02
[52] U.S. Cl. .................................... 364/826; 364/862; 358/133
[58] Field of Search ............... 364/826, 825, 861, 862; 358/133, 138, 13

[56] References Cited

U.S. PATENT DOCUMENTS

| 4,092,725 | 5/1978 | Hershman | 364/826 |
| 4,245,330 | 1/1981 | Rebourg | 364/826 |
| 4,357,677 | 11/1982 | Rebourg | 364/826 |
| 4,389,673 | 6/1983 | Despois et al. | 364/826 |

Primary Examiner—Jerry Smith
Assistant Examiner—Michael R. Fleming

[57] ABSTRACT

Hadamard transformer using charge transfer devices. The transformer comprises a charging register with at least N electrodes and doped bands making it possible to transfer the N samples charged in the charging register to the transformer calculating register.

12 Claims, 7 Drawing Figures

APPARATUS FOR PERFORMING A HADAMARD TRANSFORMATION

BACKGROUND OF THE INVENTION

The present invention relates to a Hadamard transformer using charge transfer devices.

U.S. Pat. No. 4,357,677 describes a device which comprises:

a charge transfer device comprising a plurality of electrodes arranged in a line, an input circuit able to form, on the basis of an input signal, sequences of N samples, which are the samples to be transformed, followed by the conversion of each sample into charge packets or groups, injecting the latter at appropriate times beneath appropriate electrodes of the charge transfer device, a control circuit for the transfer of charges from one electrode to the next, a differential charge reader constituted by two charge measuring circuits and a differential amplifier with two inputs, one being a reversing input and the other a non-reversing input and each connected to one of the measuring circuits, certain of the electrodes, called reading electrodes, being connected to one or other of the two measuring circuits, so that each electrode makes a positive or negative contribution to the formation of the reading signal, a circuit for the formation of output samples from the signal supplied by the differential reader.

The arrangement of the electrodes and the control of the times for the injection and the transfer of charges beneath these electrodes are such that at each output sample formation time, the N groups of charges corresponding to the N input signals are located beneath reading electrodes, whose signs relative to the respective contributions correspond to the signs of the linear relation coefficients linking the output sample with the N input samples.

A disadvantage of certain of the devices described in the aforementioned patent is that for transformations with a rank higher than 2, the charge transfer frequency must be a multiple of the sampling frequency. This is more particularly the case for the variant in which the charge transfer device comprises $N^2$ reading electrodes ($N>2$) distributed into N groups of N electrodes each, the sequence of the signs of the electrodes of one group being identical, with the sequence reversed, of the signs of a row of the matrix representing the transformation. In this case, the input circuit injects the charge groups beneath the first electrode of the first group and the transfer frequency is equal to N times the sampling frequency.

Moreover, with the devices of the aforementioned patent, it is necessary to use two charge transfer rows operating in alternating manner, one carrying out the actual transformation operations, while the other receives the new samples to be processed and vice versa.

BRIEF SUMMARY OF THE INVENTION

The present invention obviates the two first-mentioned disadvantages to the extent that it permits, on the one hand, working at a transfer frequency equal to the sampling frequency and, on the other hand, the use of one device instead of two, while maintaining the continuous nature of the processing.

This double result is achieved through the use of a special input circuit making it possible to both receive the samples to be transformed and the introduction of said samples at the desired time and place into the charge transfer device for performing the transformation.

To this end, the input circuit used in the present invention comprises, apart from an input element receiving the signal to be processed and sampling it, a special charge transfer device separate from the charge transfer device used for calculating the transformation and whose function is to charge the groups of samples to be processed (for this reason it is called "charging register" hereinafter). This register comprises at least N electrodes, if N is the rank of the transformation to be carried out, in such a way that it can charge groups of N samples $X_1, X_2 \ldots X_N$.

The input device also comprises means for the simultaneous transfer of N charged samples in the register towards the charge transfer device used for calculating the transformation. According to the invention, these transfer means are constituted by diffused doped areas (hereinafter called "diffusions") located in the semiconductor substrate on which are provided the electrodes forming the charge transfer devices. There is a number N of such areas and they are in the form of bands or strips connecting each of the electrodes of the charging register to one of the electrodes of the device used for calculating the transformation. The transfer of charges from one device to another takes place either by a careful choice of the control signals applied to the charging register and to the charge transfer device, or under the control of transfer grids or electrodes overlapping the diffusions and raised to appropriate variable potentials, the two systems being combinable.

When the N samples have been introduced into the charge transfer device used for calculating the transformation, they pass from electrode to electrode with the timing of a transfer signal, whereof the frequency, as has been stated hereinbefore, is equal to the sampling frequency.

The present invention also relates to special embodiments of the charge transfer device used for the calculation of the transformed samples. These embodiments are adapted to the special means for introducing the samples according to the present invention and they serve to reduce the number of electrodes used to below the value $N^2$.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

In the following description and in order to simplify the notations, consideration will only be given to the sign of the coefficients of the matrix defining the transformation to be carried out, thus omitting the unitary values of these coefficients. However, to simplify the terminology, it will be indicated whether each reading electrode is positive or negative, depending on whether its contribution to the formation of the reading signal is itself positive or negative.

Figure 1:
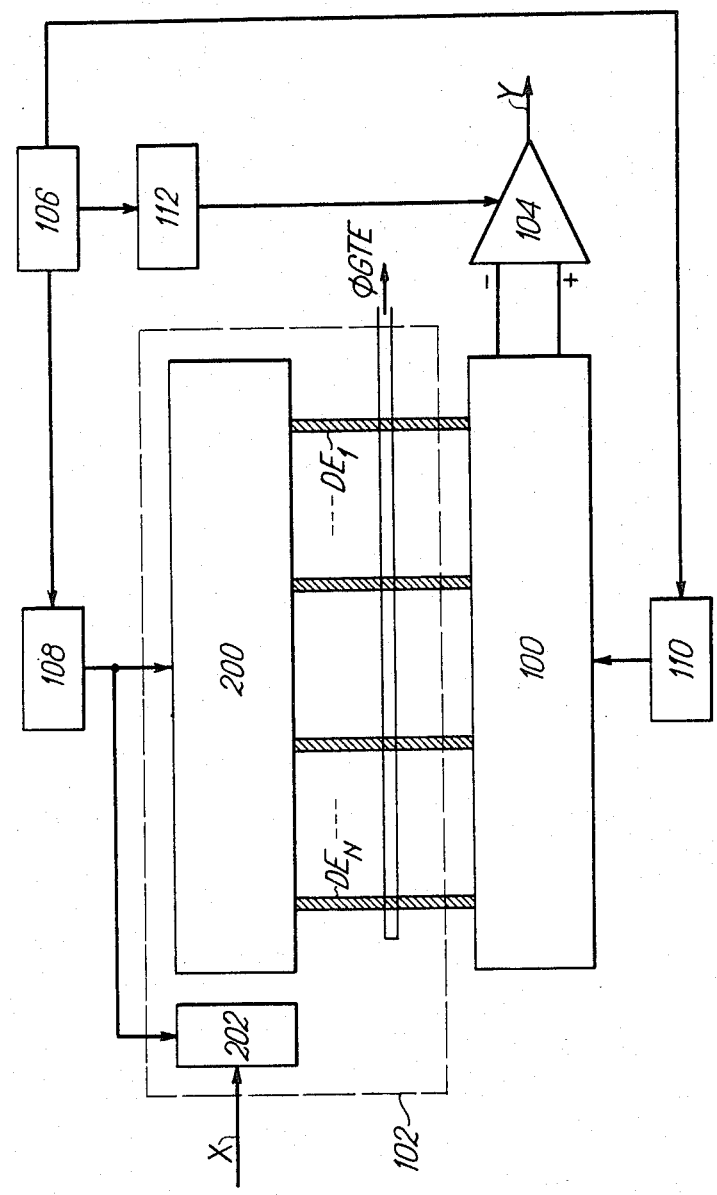
FIG. 1 a block diagram of the transformer according to the invention.

FIG. 1 diagrammatically represents the embodiment according to the invention. The apparatus shown comprises means already described in U.S. Pat. No. 4,357,677, namely a charge transfer device 100 for calculating the transformation, an input circuit 102 receiving the input signal X to be processed and a differential reader 104 supplying the transformed signal Y, a clock 106 which times both a control circuit 108 for input circuit 102, a circuit 110 controlling the transfer of charges into device 100 and a circuit 112 controlling the sampling of output signal Y.

It is pointed out that the operating principle of this apparatus is as follows. The input circuit 102 receives the signal X to be processed, converts the signal into samples and converts these samples into groups of electrical charges. Circuit 108 is able to produce pulses for controlling this sampling operation and it also controls the injection of corresponding charge groups into charge transfer device 100. The latter transfers these charge groups beneath its electrodes with the timing of the transfer pulses supplied by circuit 110. Reader 104 reads the charges located beneath the electrodes to which its inputs are connected at times defined by circuit 112. These times are those at which the charge groups representing the N samples $X_1, X_2 \ldots X_N$ are located beneath the electrodes, whose signs correspond to one of the N linear relations defined by the Hadamard matrix representing the transformation to be performed. The output of amplifier 104 then successively supplies N samples $Y_1, Y_2 \ldots Y_N$, which are the transformations of $X_1, X_2 \ldots X_N$ by the matrix in question.

This structure and this operation are in accordance with what is described in the above-mentioned U.S. Pat. No. 4,357,677. The originality of the present invention is essentially based on the structure of input circuit 102 and, to a lesser extent, that of device 100.

Figure 2:
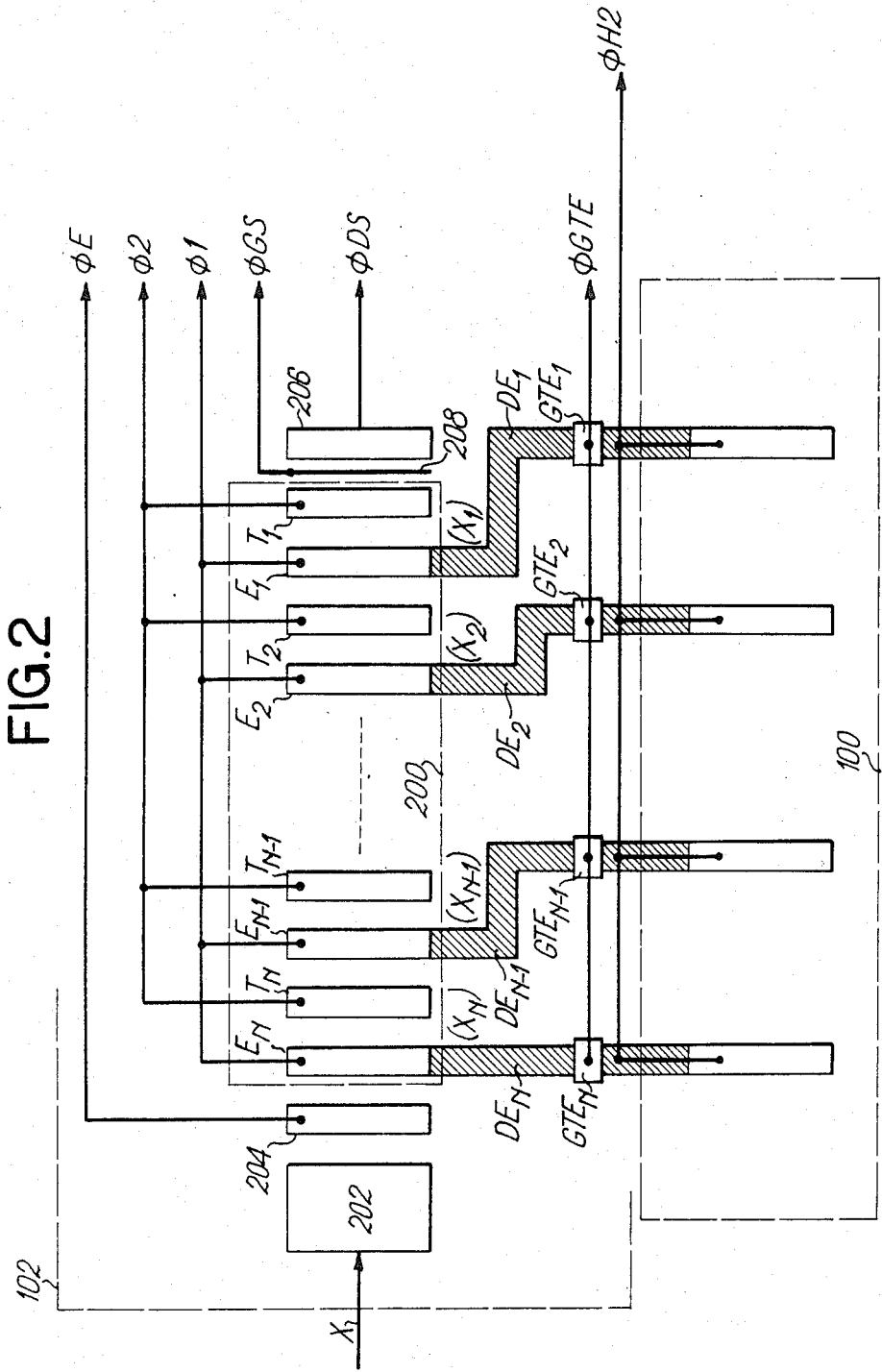
FIG. 2 a diagram of the input circuit according to the invention.

Input circuit 102 is diagrammatically shown in FIG. 2. It comprises a charge transfer device 200 formed by N work electrodes $E_1, E_2 \ldots E_N$ and the same number of transfer electrodes $T_1, T_2 \ldots T_N$. These electrodes are controlled by two control lines respectively receiving the signals $\emptyset 1$ and $\emptyset 2$.

Device 200 is preceded by an input element 202 which receives the signal X to be processed and converts it into charges. This element is followed by a sampling electrode 204 raised to a potential $\emptyset E$, which determines the times for sampling and introducing the samples into device 200. The latter can be followed by an output diode 206 separated from the last transfer electrode $T_1$ by a transfer grid 208 raised to a potential $\emptyset GS$.

The means shown in FIG. 2 also comprise N input diffusions $DE_1, DE_2, \ldots DE_N$ extending between the N electrodes $E_1 \ldots E_N$ of the charging register and the N electrodes of the charge transfer device 100. These diffusions, in the form of bands or strips, are obtained by diffusing a doping impurity into the semiconductor substrate used for forming the two charge transfer devices 100, 200. If the substrate is of type p, the diffusions in question are of type n and vice versa. These diffusions are provided with transfer electrodes $GTE_1, GTE_2 \ldots GTE_N$, all raised to a potential $\emptyset GTE$. These electrodes are able to authorize or prevent the transfer of charges to device 100 in accordance with the values of $\emptyset 1$, $\emptyset GTE$ and $\emptyset H2$.

Figure 3:
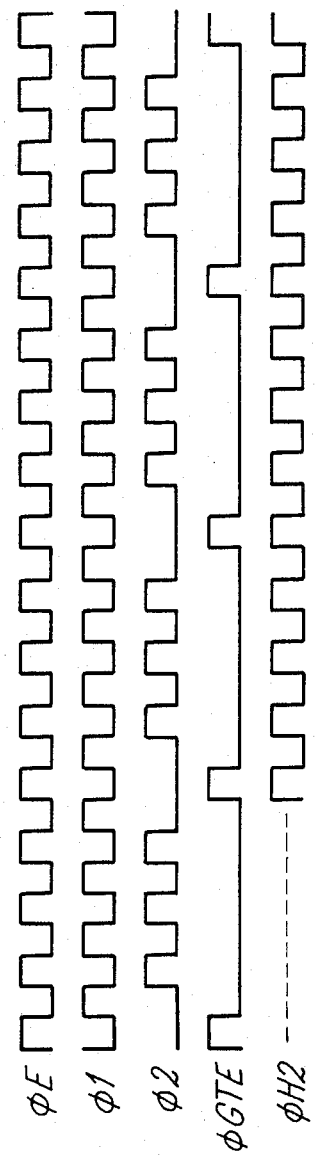
FIG. 3 a chronogram illustrating the operation of the input circuit.

FIG. 3 is a chronogram illustrating the variations of the control potentials used in the device of FIG. 2, namely the sampling potential $\emptyset E$, potentials $\emptyset 1$ and $\emptyset 2$ controlling the displacement of the samples into register 200, potentials $\emptyset 1$, $\emptyset GTE$ and $\emptyset H2$ determining the transfer of N groups of charges into device 100. In the illustrated case, the number N is taken as equal to 4 for simplification purposes.

The input circuit then operates in the following manner. The N samples $X_1, X_2 \ldots X_N$ are charged beneath electrodes $E_1, E_2 \ldots E_N$ of register 100 by N (in the present case 4) sampling $\emptyset E$ and transverse $\emptyset 1, \emptyset 2$ clock strokes. During this time, signal $\emptyset GTE$ is kept at low level. When charging is at an end, $\emptyset GTE$ is raised to a high level at the same time as $\emptyset H2$, while $\emptyset 1$ is at a low level, which forces back the charges of electrodes $E_1 \ldots E_N$ from charging register 200 towards device 100 where the actual transformation can take place.

A description will now be given of special embodiments of the device of FIG. 1 suitable for the sample introduction means considered hereinbefore.

Device 100 can naturally be in accordance with certain of the devices described in U.S. Pat. No. 4,357,677 and particularly one that comprises N groups of in each case N electrodes. In this case, the samples must be introduced at the input of each of these groups. However, as stated hereinbefore, the disadvantage of this embodiment is the necessity of a large number of electrodes ($N^2$). This is the reason why the present invention provides other charge transfer devices, which take better advantage of special input circuits used and which make it possible to reduce this number of electrodes to a value below $N^2$.

This search for devices with a reduced number of electrodes is justified for at least two reasons:

the less electrodes there are, the smaller the overall dimensions of the device, the lower its cost and the better its performance (the transfer losses are lower), the less electrodes there are, the higher the number of reading electrodes compared with the other electrodes (particularly transfer) and the higher the ratio of the useful signal to the unwanted signal.

In this connection, advantageous solutions are obtained by seeking to arrange electrodes in such a way that those having identical signs can coincide. An example corresponding to a four-point transformation will firstly be considered to illustrate the method. This consists of the four-point transformation characterized by the matrix relationship:

$$\begin{bmatrix} Y_1 \\ Y_2 \\ Y_3 \\ Y_4 \end{bmatrix} = \begin{bmatrix} + & + & + & + \\ - & - & + & + \\ + & - & - & + \\ - & + & - & + \end{bmatrix} \begin{bmatrix} X_1 \\ X_2 \\ X_3 \\ X_4 \end{bmatrix}$$

A charge transfer device with $4 \times 4 = 16$ electrodes in line can be obtained by giving to a first group of four electrodes the signs of the fourth column of the matrix, i.e. (+ + + +), then to the four electrodes of a following group the signs of the third column (+ + − −), then to the four others the signs of the second column (+ − − +) and finally to the four electrodes of a final group the signs of the first column (+ − + −). Thus, a total of 16 electrodes with the following respective signs is obtained:

$$+\ +\ +\ +\ +\ +\ -\ -\ +\ -\ -\ +\ +\ -\ +\ -$$
$$\uparrow\qquad\quad\uparrow\qquad\quad\uparrow\qquad\quad\uparrow$$
$$X_4\qquad\quad X_3\qquad\quad X_2\qquad\quad X_1$$

Samples $X_1$, $X_2$, $X_3$ and $X_4$ must then be introduced at the points marked by the arrows.

The first sample is obtained when the samples are beneath the first electrodes of each group, whereby the respective signals of these electrodes are + + + +. Thus, the first sample corresponds to $X_4+X_3+X_2+X_1$, i.e. to $Y_1$. The second sample corresponds to the four following signs in each group, i.e. + + − −, or in other words to $X_4+X_3-X_2-X_1$, i.e. which is $Y_2$, etc.

This arrangement can be represented by marking on the same line the signs of the electrodes at which the samples are located at a given sampling time and then on the next row the position of the same samples after they have advanced by one rack and so on. This representation is as follows for the envisaged 16 electrode device:

```
+     +     +     +
  +     +     −     −
    +     −     −     +
      +     −     +     −
```

It should be noted that the fourth column has the same sign (+) as the fifth column. Thus, the distribution of these electrodes can be differently organized to make the columns having the same sign coincide, which makes it possible to reduce their number. For example, the following distribution can be chosen:

```
+   + +     +
  +   + −       −
    +   − −       +
      +   − +
```

This distribution only contains 10 columns instead of 16. Such a solution corresponds to a 10 electrode device with the respective line of signs:

$$+\ +\ +\ +\ +\ +\ +\ -\ -\ +\ -\ +\ -$$
$$\uparrow\qquad\quad\uparrow\qquad\quad\uparrow$$
$$X_4\qquad\quad X_3\qquad\quad X_2\qquad\quad X_1$$

The introduction of the four samples is then marked by the arrows.

The solution described hereinbefore corresponds to a matrix, which is symmetrical with respect to its second diagonal. It is also possible to have solutions with a reduced number of electrodes for matrices symmetrical with respect to the first diagonal. For example, the transformation corresponding to the matrix:

$$\begin{bmatrix} - & - & + & + \\ - & - & - & - \\ + & - & + & - \\ + & - & - & + \end{bmatrix}$$

can be obtained with a 12 electrode device in accordance with the following arrangement:

```
+     +     −     −
  −     −     −     −
    −     +     −     +
      +     −     −     +
```

Disposed in a line the electrodes will then have the respective following signs.

$$+\ -\ -\ +\ -\ +\ -\ -\ -\ +\ +$$
$$\uparrow\qquad\quad\uparrow\qquad\quad\uparrow\qquad\uparrow$$
$$X_4\qquad\quad X_3\qquad\quad X_2\quad X_1$$

The same method can be used for matrices of rank 8. For example, the transformation characterized by the $$\begin{bmatrix} - & + & - & - & - & + & + & + \\ + & - & + & + & - & + & + & + \\ - & + & + & + & + & - & + & + \\ + & - & - & - & + & - & + & + \\ - & - & + & - & - & - & - & + \\ + & + & - & + & - & - & - & + \\ - & - & - & + & + & + & - & + \\ + & + & + & - & + & + & - & + \end{bmatrix}$$

can be obtained with the following set of electrodes:

i.e. 29 electrodes of respective signs:

$$+\ +\ +\ +\ +\ +\ +\ -\ -\ -\ +\ +\ -\ -\ +\ +\ -\ +\ -\ -\ +\ -\ +\ -\ +\ -\ +$$
$$\uparrow\qquad\quad\uparrow\quad\uparrow\qquad\uparrow\uparrow\qquad\uparrow\uparrow\qquad\quad\uparrow$$
$$X_8\qquad X_7\quad X_6\qquad X_5\ X_4\quad X_3\ X_2\qquad\quad X_1$$

For the matrix symmetrical with respect to the following first diagonal:

$$\begin{bmatrix} + & + & - & - & + & + & - & - \\ + & + & - & - & - & - & + & + \\ - & - & - & - & + & + & + & + \\ - & - & - & - & - & - & - & - \\ + & - & + & - & + & - & + & - \\ + & - & + & - & - & + & - & + \\ - & + & + & - & + & - & - & + \\ - & + & + & - & - & + & + & - \end{bmatrix}$$

a possible 42 electrode solution is:

$$\underset{X_8}{\overset{\uparrow}{-++}}-\underset{X_7}{\overset{\uparrow}{++}}+\underset{X_6}{\overset{\uparrow}{-+}}--\underset{X_5}{\overset{\uparrow}{+-+-+}}-\underset{X_4}{\overset{\uparrow}{+----}}---\underset{X_3}{\overset{\uparrow}{+++}}+----\underset{X_2}{\overset{\uparrow}{++}}--\underset{X_1}{\overset{\uparrow}{++--}}$$

To illustrate these considerations, a special embodiment of the apparatus according to the invention will now be described in connection with FIGS. 4 and 5 in the case of a four-point device using the aforementioned configuration:

$$+ + + + - - + (+) - + -$$

To facilitate the designation of all the electrodes of the device (reading, transfer, input, output and other electrodes), these are designated by their rank ranging from 5 for the electrode at the extreme left to 31 for the electrode at the extreme right.

The positive reading electrodes occupy the respective ranks 6, 8, 10, 12, 18, 22, 26 and are controlled by a signal $\emptyset+$. The negative electrodes occupy ranks 14, 16, 24, 28 and are controlled by a signal $\emptyset-$. The sample introduction electrodes $I_1$, $I_2$, $I_3$ and $I_4$ are those of ranks 21, 11, 9 and 5, which are connected to the input diffusions $DE_1$ to $DE_4$.

The apparatus consequently comprises four electrodes used for the ejection of the process charges, i.e. $S_1$, $S_2$, $S_3$ and $S_4$ of respective ranks 29, 19, 17 and 13. They are connected to so-called output diffusions $DS_1$, $DS_2$, $DS_3$ and $DS_4$ identical to those used for the introduction of the samples. These diffusions are provided with transfer control grids $GTS_1$ to $GTS_4$ raised to a potential $\emptyset GTS$. That part of the diffusions located beyond the GTS grids with respect to electrodes $S_i$ is raised to a fixed voltage vs and these charges can consequently be dissipated when $\emptyset GTS$ is at high level.

To prevent certain output diffusions DS coinciding with input diffusions DE, which would lead to the ejection of the charges just after their introduction, it may be necessary to provide a supplementary electrode for artificially bringing about a displacement between the introduction and ejection electrodes. This is the case for the electrode of rank 20 positioned between $DS_2$ and $DE_1$, which prevents the introduction of sample $X_1$ taking place level with the ejection of sample $X_2$. The end of the apparatus is marked by a final electrode of rank 31 associated with a diffusion $DS_5$, itself provided with a transfer grid $GTS_5$ raised to potential $\emptyset GTS$.

Upstream of each electrode, there is a transfer grid represented by a dash, said grid being connected to the following electrode (which is the case of introduction electrodes $I_1$ to $I_4$, ejection electrodes $S_1$ to $S_4$ and transfer electrodes of ranks 7, 15, 23, 25, 27) or connected to one or the other of the two control lines carrying signals $\emptyset 1$ and $\emptyset BL1$. The sample introduction circuit is the same as that of FIG. 2.

Figure 4:
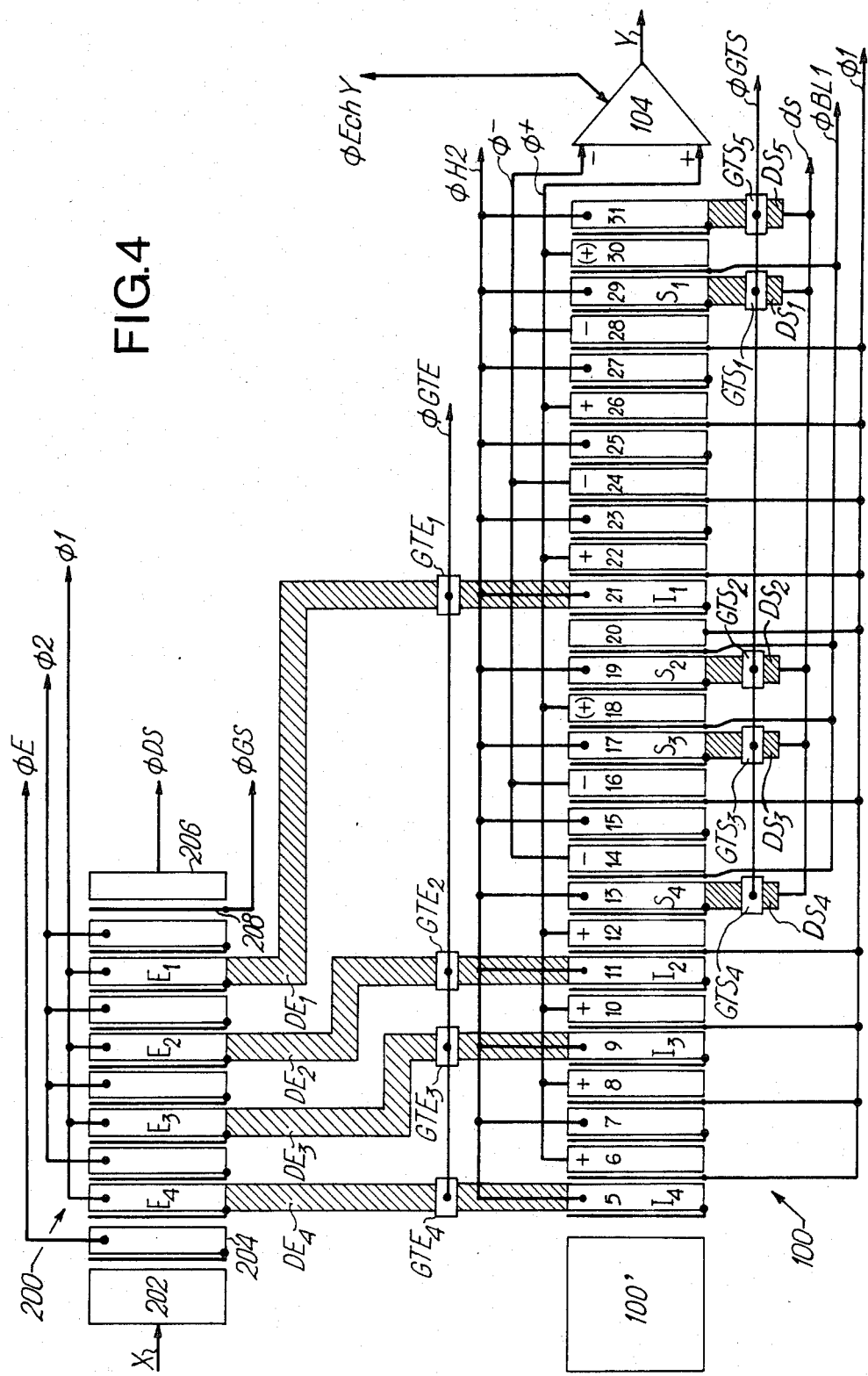
FIG. 4 an embodiment of a four-point transformer.
Figure 5:
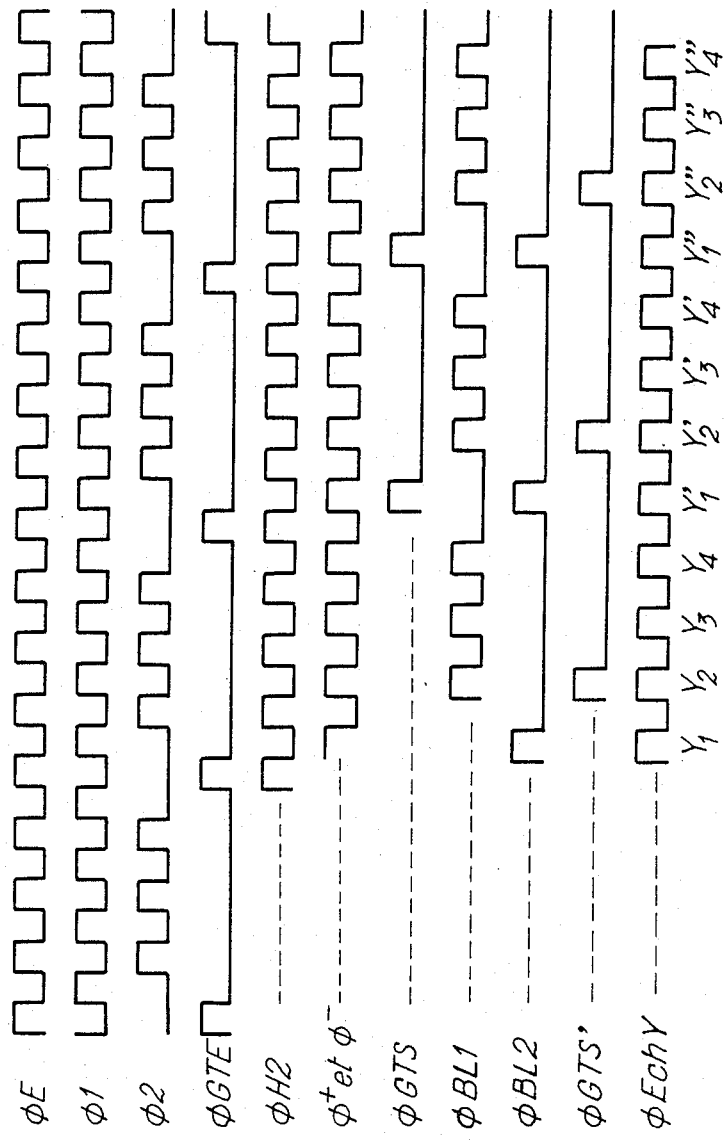
FIG. 5 a chronogram showing the evolution of certain of the control signals used in the device of FIG. 4.

The chronogram of FIG. 5 illustrates the operation of the apparatus shown in FIG. 4. The first five lines relate to the charging register of the input circuit and to the introduction of samples $X_1$ to $X_4$ into calculating device 100. This introduction is controlled by signal $\emptyset GTE$. Signals $\emptyset+$, $\emptyset-$ and $\emptyset H2$ time the transfer of the charges into the calculating device. Signal $\emptyset GTS$ determines the output times of the four samples, once they have been processed. Signal $\emptyset BL1$ controls the grids following the output electrodes $S_1$ to $S_4$. This signal is in phase with $\emptyset+$ and $\emptyset-$, except when $\emptyset GTS$ is positive, in which case $\emptyset BL1$ is negative. The final line represents the signal $\emptyset EchY$ controlling the sampling of signal Y. The function of signals $\emptyset BL2$ and $\emptyset GTS'$ will be described hereinafter.

The apparatus then operates in the following manner. The samples to be transformed are firstly introduced into charging register 200 and at the fourth clock stroke samples $X_1$, $X_2$, $X_3$ and $X_4$ are located beneath electrodes $E_1$, $E_2$, $E_3$ and $E_4$. The instant after this, $\emptyset 1$ becomes zero and $\emptyset 2$ remains blocked. Signal $\emptyset GTE$ which was in the low state up to then, passes into the high state, as does $\emptyset H2$. The four samples are then transferred by the input diffusions beneath introduction electrodes $I_1$, $I_2$, $I_3$ and $I_4$ of register 100. Signals $\emptyset+$ and $\emptyset-$ become positive, which displaces by one step the four samples which are then beneath the electrodes making it possible to obtain the first transformed sample $Y_1$. The samples then advance into device 100 with the timing of signals $\emptyset+$ and $\emptyset-$ and it is possible to successively obtain the transformed samples $Y_2$ (samples beneath electrodes of rank 24, 24, 12, 8), then $Y_3$ (samples beneath electrodes of rank 26, 16, 14, 10) and $Y_4$ (samples beneath electrodes of rank 28, 18, 16, 12).

Signal $\emptyset GTE$ which remained at a low level during this calculating phase then passes to high level and four new samples are introduced into the calculating device. At the following clock stroke, the first four samples processed are transferred beneath the output electrodes $S_1$, $S_2$, $S_3$ and $S_4$. Simultaneously, $\emptyset GTS$ passes to high level and signal $\emptyset BL1$ remain blocked at low level, which has the effect of ejecting the charges through the output diffusions $DS_1$, $DS_2$, $DS_3$ and $DS_4$ towards the output diode. An identical processing then takes place with the four new samples introduced.

Figure 6:
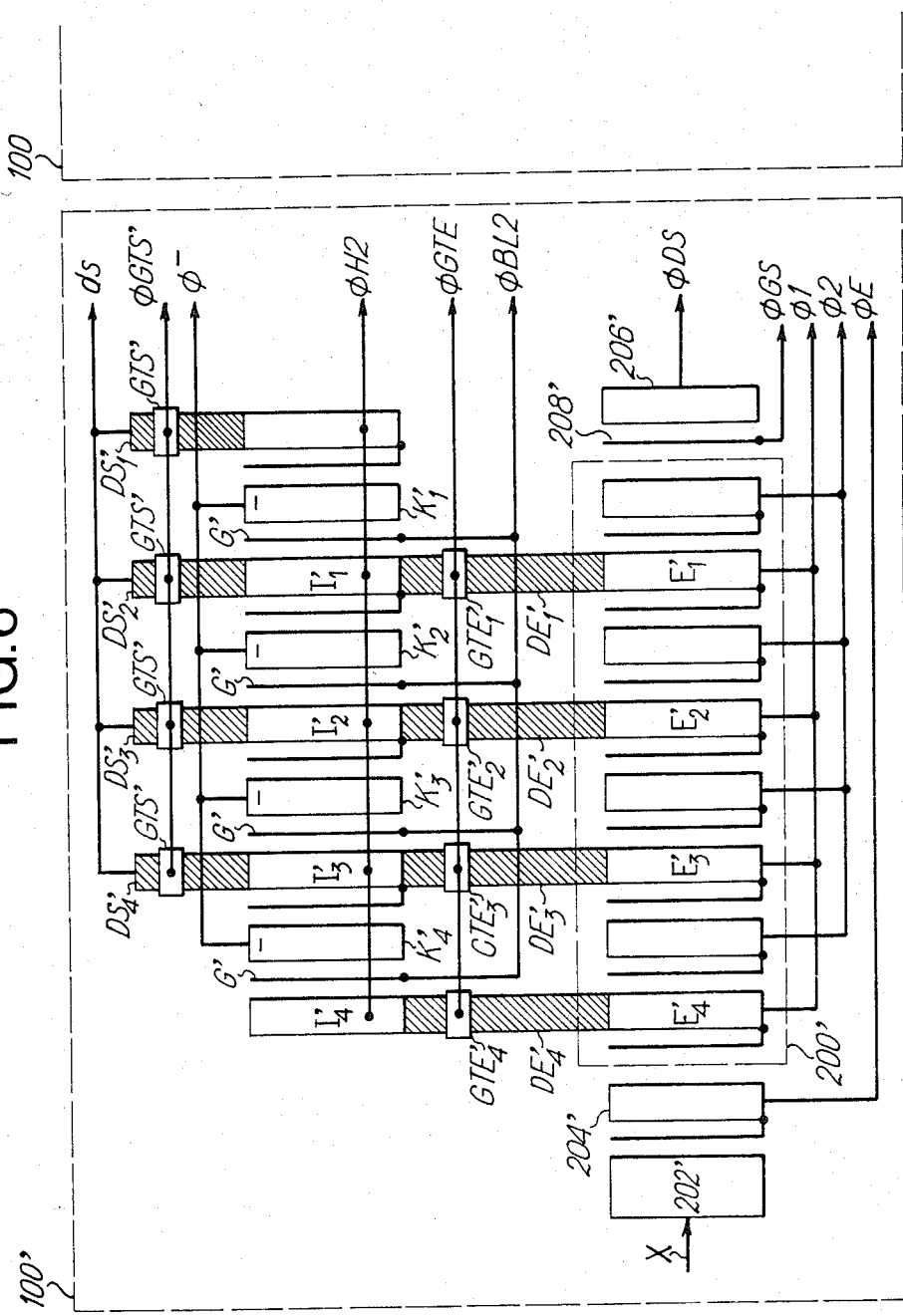
FIG. 6 a balancing circuit associated with the circuit of FIG. 4.

In order that the differential reader 104 is balanced, the charge transfer device to which it is connected must have the same number of positive and negative electrodes for each transformed sample. If this condition is satisfied for samples $Y_2$, $Y_3$ and $Y_4$ for which the differential reader sees two positive electrodes and two negative electrodes, this is not the case with $Y_1$ for which the four electrodes in question have a positive sign. It is therefore necessary to provide device 100 with a balancing device formed by 100′ represented diagrammatically at the extreme left of FIG. 4 and shown in greater detail in FIG. 6.

The balancing circuit shown comprises a first part which is a replica of the charging register of FIG. 2. The elements forming this part carry the same numerical references as in FIG. 2, but accompanied by an apostrophe. There are four electrodes $E'_1$ to $E'_4$ preceded by a sampling electrode 204′ supplied by an input circuit 202′ and optionally by an output electrode 206′.

The second part is constituted by a charge transfer device with four introduction electrodes $I'_1$ to $I'_4$. These four electrodes are connected by four diffusions $DE'_1$ to $DE'_4$ to electrodes $E'_1$ to $E'_4$ of the charging register, said diffusions being provided with control grids GTE' raised to potential ØGTE. The charge transfer device also comprises four interposed electrodes $K'_1$ to $K'_4$ connected to a connection carrying signal Ø−. Electrodes $K'_1$ to $K'_4$ are separated from electrodes $I'_1$ to $I'_4$ by grids G' raised to a potential ØBL2.

This charge transfer device is provided with four output diffusions $DS'_1$ to $DS'_4$ controlled by output electrodes GTS' raised to a potential ØGTS'. Most of the control signals applied to this balancing system are those of the device of FIG. 4, together with signals ØBL2 and ØGTS' represented at the bottom of the chronogram of FIG. 5.

The balancing device then operates in the following way. Four samples $X_1$ to $X_4$ are charged into register 200' at the same time as the four samples $X_1$ to $X_4$ enter register 100. When samples $X_1$ to $X_4$ are transferred into calculating device 100, four samples corresponding to a zero input signal are transferred into the balancing device by means of ØGTE. At the following clock stroke, these four samples are beneath the four positive electrodes in calculating device 100 and beneath the four negative electrodes of balancing device 100', which are connected to Ø−. Thus, the differential reader 104 sees four positive samples and four negative samples. It is therefore balanced and supplies the transformed sample $Y_1$. At the following clock stroke ØGTS' is raised to high level and the four samples are ejected out of the balancing device. The transformed samples $Y_2$, $Y_3$ and $Y_4$ are calculated without any intervention of the balancing system, which only fulfills its function again during a new introduction of a group of four samples.

It should be noted that with this variant of the balancing device, the total number of electrodes connected to the positive input of the differential reader is 7 (electrodes of ranks 6, 8, 10, 12, 18, 22, 26) whereas the number of electrodes connected to the negative input is 8 (bearing in mind the four electrodes of the balancing device). It is therefore necessary to provide a final balancing to increase 8 the number of positive electrodes. This is the function of the electrode of rank 30 added at the end of the device.

It is naturally possible to bring about balancing with other means. For example, it is possible to use a negative electrode (e.g. of rank 16) for balancing the charges during the calculation of the first transformed sample. To this end, one of the diffusions of the charging register of the balancing system must be connected to the electrode of rank 15. The number of calculating electrodes is then 7 positive electrodes and 7 negative electrodes, which would no longer necessitate a supplementary electrode such as 30.

Balancing can be brought about in a simpler manner by means of a register having a single electrode connected to the negative input of the differential reader, the condition being that the surface of this electrode is N times greater than that of the electrodes of the calculating register (N: dimension of the transformation). In this case, input circuit 202' is followed by a grid, which only introduces a sample beneath the compensation electrode (N times longer) at the time corresponding to component + + +. . . This compensation register is followed by a diode enabling the dissipation of the charges used for this compensation. This solution is much simpler, but less accurate than that of FIG. 6.

The devices described hereinbefore can form both forward transformers and reverse transformers, if it is ensured that the order of the connections is reversed. However, if it is desired to botain transformers, which can both carry out a forward transformation and a reverse transformation, it is necessary to use as a basis a matrix which is symmetrical with respect to the first diagonal. Examples of such matrices are given hereinbefore with the corresponding electrode configurations. Other examples will now be given.

For a four-point transformation, the following arrangement is of particular interest:

+ − − + − + − − − + +

With two supplementary positive electrodes for balancing, a 14-electrode device is obtained with a ratio of the number of work electrodes to the total number of electrodes equal to 4/10.

For an 8-point transformation, the arrangement given hereinbefore also satisfies the symmetry criterion. 25 positive electrodes and 17 negative electrodes correspond thereto. In order to balance it, it is necessary to have 8 negative electrodes, i.e. in all 50 electrodes, 8 being used for each transformation, namely a ratio of 8/42.

Solutions of this type can be systematically sought in accordance with a principle like that described in the U.S. Pat. No. 4,357,677.

It is obvious that several devices like those described hereinbefore can be combined, e.g. for introducing samples supplied by a first device into a second device, the latter finishing the calculations started in the former.

Except in the case of a transformation corresponding to a matrix symmetrical with respect to the first diagonal, the reverse transformer is obtained, on the basis of a forward transformer, by reversing the order of the connections. Thus, the reverse transformer is generally different from the forward transformer. However, it is possible, on being willing to accept a slight increase in the complexity of the apparatus, to produce devices which can be used both as a forward transformer and as a reverse transformer.

Figure 7:
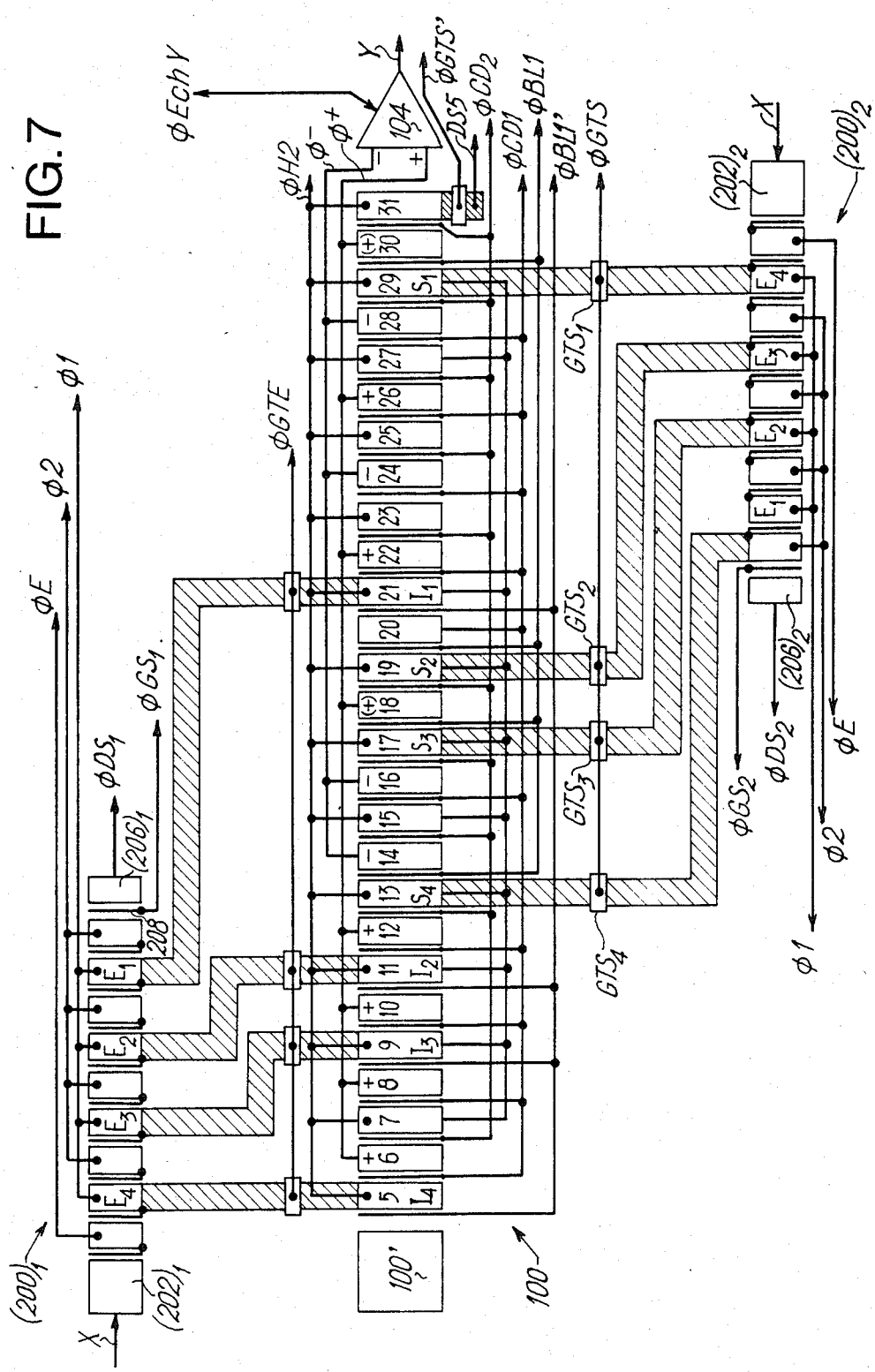
FIG. 7 a transformer operating in both the forward direction and in the reverse direction.

Such a device is illustrated in FIG. 7 corresponding to the transformer of FIG. 4, in which the output diodes $DS_1, DS_2$ . . . are replaced by a register $(200)_2$ identical to the charging register (200) of FIG. 4. The charging register of the transformer of FIG. 7 carries the reference $(200)_1$.

Register $(200)_1$ can collect the charges corresponding to the samples, which have just been processed and then dissipate them into its output diode $(206)_2$. However, it can also function as a charging register and receive samples by its input circuit $(202)_2$, register $(200)_1$ then functioning as an output register. The sample processing device 100 is then slightly modified compared with that of FIG. 4 with regard to the connections of the transfer grids represented by a dash between the work electrodes. Thus, these transfer grids must now be able to reverse the charge flow direction, as a function of whether one of the registers $(200)_1$ or $(200)_2$ operates on a charging basis or on an output basis. To this end, the transfer grids preceding electrodes 5, 9, 11, 21 are joined to the same connection to which is applied a signal ØBL1. The other grids preceding the uneven reference electrodes are connected to a connection to which is applied a first control signal ØCD1. The grids preceding electrodes 14, 18 and 20 are connected to a connection carrying a signal ØBL1. With regard to the even reference electrodes, they are connected to a connection to which is applied a second control signal ØCD2.

This device functions in the following way. As a forward transformer, i.e. in the case corresponding to FIG. 4, the connections carrying ØBL1 and ØCD2 are connected to that carrying Ø1, while the connection carrying ØCD1 is connected to that of ØH2. In device 100, the charges advance from left to right. After obtaining four components of the transformation, signal ØGTS makes it possible to direct the samples through the diffusions beneath the four electrodes of register $(200)_2$. These charges are then ejected by output diode $(206)_2$, while a new series of four samples is charged into register $(200)_1$.

Register $(200)_2$ can also function as a charging register and register $(200)_1$ as an output register. Device 100 must then operate from right to left. For this purpose, the connections carrying ØBL1 and ØCD1 are connected to that carrying Ø1 and connections ØCD2 to that of ØH2. Moreover, signals ØGTE and ØGTS are interchanged.

What is claimed is:

1. An apparatus for performing a Hadamard transformation, comprising:
   (a) a first input circuit having an input receiving an input signal and having an output delivering sequences of N input samples $(X_1, X_2 \ldots X_N)$, at a sample frequency;
   (b) a first auxiliary charge transfer device with at least N work electrodes in line $(E_1, E_2 \ldots E_N)$, said first auxiliary charge transfer device being realized on a semiconductor substrate having a particular doping type and being connected to said first input circuit, and being provided with means for controlling the transfer from one electrode to the next, with a frequency equal to said sample frequency;
   (c) a first set of N diffusion bands $(DE_1, DE_2 \ldots DE_N)$ disposed in said semiconductor substrate and having a doping type opposite to that of said substrate, each diffusion band having first and second extremities, said first extremity being connected to one of said work electrodes of said auxiliary charge transfer device;
   (d) a first set of N transfer grids $(GTE_1, GTE_2 \ldots GTE_N)$ disposed on said N diffusion bands, said transfer grids being connected to a connection raised to a potential (ØGTS);
   (e) a calculation charge transfer device for performing said Hadamard transformation, said calculation charge transfer device having a plurality of electrodes arranged in a line and comprising a first set of N introduction electrodes, a second set of N extraction electrodes, a third set of reading electrodes, said N introduction electrodes being connected to said second extremity of said N diffusion bands, said calculation charge transfer device comprising further control means for transferring charges from one electrode to the next, with a frequency equal to said sampling frequency;
   (f) a differential charge reader comprising a differential amplifier with two inputs, one input being a reversing input and the other input being a nonreversing input, said reversing input being connected to a first group of electrodes belonging to said third set of reading electrodes, said first group of electrodes being set to have a sign −, said nonreversing input being connected to a second group of electrodes belonging to said third set of reading electrodes, said second group of electrodes being set to have a sign +, said reader further comprising sampling means at said sampling frequency and having an output supplying output samples which are transformed samples of said input samples by said Hadamard transformation.

2. An apparatus according to claim 1, comprising means consisting of a second input circuit, a second auxiliary charge transfer device with a second set of N diffusion bands and a second set of N transfer grids thereon, said above-mentioned means being arranged symetrically to elements (a) to (d) with respect to said calculation charge transfer device, said first and second auxiliary charge transfer devices being operable as charging or output register, said calculation charge transfer device being operable with a charge transfer in one and in another direction.

3. An apparatus according to claim 2, wherein the electrodes belonging to one group and having a particular sign coincide with the electrodes of the adjacent group having the same sign, the total number of electrodes of the calculating register then being below $N^2$.

4. An apparatus according to claim 3, for a transformation relating to sequences of four samples, wherein the calculation charge transfer device comprises 10 reading electrodes of respective signs.

$+ + + - - + - + -.$

5. An apparatus according to claim 3, for a transformation relating to sequences of four samples, wherein the calculation charge transfer device comprises 12 reading electrodes of respective signs.

$+ - - + - + - - - - + +.$

6. An apparatus according to claim 3, for a transformation relating to sequence of eight samples, wherein the calculation charge transfer device comprises 42 reading electrodes of respective signs.

$- - + + - - + + - - - - + + + + - -$
$- - - - - - + - + - + - + - - + -$
$+ + - - + + -.$

7. An apparatus according to claim 3, for a transformation relating to sequences of eight samples, wherein the calculation charge transfer device comprises 29 reading electrodes of respective signs.

$+ + + + + + + - - - - + + - - + +$
$- + - - + - + - + - +.$

8. An apparatus according to claim 1, wherein the calculation charge transfer device comprises N electrodes $(S_1, S_2 \ldots S_N)$ connected to charge ejection means.

9. An apparatus according to claim 8, wherein the charge ejection means are constituted by N diffusions $(DS_1, DS_2 \ldots DS_N)$, each associated with an output grid $(GTS_1 \ldots GTS_N)$ raised to a potential ØGTS.

10. An apparatus according to claim 1, wherein the calculation charge transfer device comprises balancing means making the number of positive electrodes equal to the number of negative electrodes.

11. An apparatus according to claim 10, wherein the balancing means comprise a charging register with N electrodes associated with a second input receiving the input signal and sampling the latter, said charging register being provided with N diffusion bands ($DE'_1 \ldots DE'_N$) associated with N transfer grids ($GTE'_1 \ldots GTE'_N$), a balancing register comprising electrodes ($K'_1, K'_2 \ldots K'_N$) which are positive and/or negative, and introduction electrodes ($I'1, I'_2 \ldots I'_N$) for recovering the N samples from said charging register.

12. An apparatus according to claim 1, wherein the calculated charge transfer device comprises $N^2$ reading electrodes in line distributed into N groups of N electrodes each, the sequence of the signs of the electrodes belonging to the same group being identical to the sequence of signs of the coefficients of a column of the matrix representing the Hadamard transformation to be performed.

* * * * *